United States Patent [19]
Kuwabara et al.

[11] Patent Number: 4,675,789
[45] Date of Patent: Jun. 23, 1987

[54] HIGH DENSITY MULTILAYER PRINTED CIRCUIT BOARD

[75] Inventors: Kiyoshi Kuwabara, Yokohama; Mikio Nishihara, Tokyo; Kazuhisa Tsunoi, Yokohama, all of Japan

[73] Assignee: Fujitsu Limited, Kawasaki, Japan

[21] Appl. No.: 811,355

[22] Filed: Dec. 20, 1985

[30] Foreign Application Priority Data

Dec. 28, 1984 [JP] Japan .................. 59-198910[U]

[51] Int. Cl.$^4$ .................................................. H05K 1/14
[52] U.S. Cl. ..................................... 361/414; 174/68.5
[58] Field of Search ....................... 174/68.5; 361/414

[56] References Cited

U.S. PATENT DOCUMENTS

| | | | |
|---|---|---|---|
| 3,519,959 | 8/1970 | Bewley et al. | 174/68.5 X |
| 3,568,000 | 3/1971 | D'Aboville | 361/414 |
| 3,680,005 | 7/1972 | Jorgeson et al. | 361/414 X |
| 3,740,678 | 6/1973 | Hill | 174/68.5 |
| 4,362,899 | 12/1982 | Borrill | 174/36 |
| 4,498,122 | 2/1985 | Rainal | 174/68.5 X |

OTHER PUBLICATIONS

Jarvell et al., Wirability Enhancement, IBM Tech. Disc. Bull., vol. 21, #9 Feb. 1979 p. 3624 relied on.

Primary Examiner—R. R. Kucia
Attorney, Agent, or Firm—Staas & Halsey

[57] ABSTRACT

A high density multilayer printed circuit board comprising generally parallel signal layers, electric source layers, and ground layers, with insulating layers arranged between the signal layers and the electric source layers, between the electric source layers and the ground layers, and between the ground layers and the signal layers respectively. Conductor portions are formed in through holes which are opened in a direction transverse to the signal layers, electric source layers, and ground layers. The conductor portions are electrically connected to the signal layers and/or the electric source layers, and/or the ground layers, through the lands thereof, the connections of the lands being substantially equally distributed among the conductor portions.

3 Claims, 6 Drawing Figures

HIGH DENSITY MULTILAYER PRINTED CIRCUIT BOARD

BACKGROUND OF THE INVENTION

1. Field of the Invention

The present invention relates to a high density multilayer printed circuit board. More particularly, it relates to a high density multilayer printed circuit board providing a number of signal layers, electric source layers, and ground layers.

2. Description of the Related Art

The high speed of electronic computers has made it desirable that a printed circuit board for mounting LSI devices be produced at a high density and in a multilayer structure.

Namely, although a small number of signal layers can be operated in a printed circuit board, it is not possible to operate more than ten signal layers. This is because an increase in the number of signal layers inevitably causes a corresponding increase in the numbers of electric source layers and ground layers, giving the resultant printed circuit board an undesirably large thickness.

Conventionally, when a large number of electric source and other layers is formed as a thick board, the lands of the electric source and other layers are electrically connected to a through hole. This through hole must be formed by a drill, and necessitates the drilling of a hole through a correspondingly large number of copper lands; this imposes a heavy load on the cutting surfaces of the drill bit, with the result that these cutting surfaces of the drill bit quickly become notched and blunted.

SUMMARY OF THE INVENTION

It is an object of the present invention to eliminate the above-mentioned problems by providing a high density multilayer printed circuit board, wherein the lands of electric source and other layers connected to through holes are formed in such a manner that these lands are substantially equally distributed in number.

It is a further object of the present invention to provide a high density multilayer printed circuit board, wherein the wear on a tool such as drill used during the production of such a board, is not more than that occurring in the production of such a board according to the prior art.

Thus, according to the present invention, there is provided a high density multilayer printed circuit board comprising a plurality of generally parallel signal layers, electric source layers, and ground layers, with insulating layers respectively intervening between each signal layer and electric source layer, between each electric source layer and ground layer, and between each ground layer and signal layer; and conductor portions formed in through holes opened in a transverse direction relative to the signal layers, electric source layers, and ground layers, the conductor portions being electrically connected to the signal layers and/or electric source layers and/or ground layers through the lands thereof, the connection of these lands being substantially equally distributed among the conductor portions.

DESCRIPTION OF THE PREFERRED EMBODIMENTS

Before describing the preferred embodiments of the present invention, an explanation will be made of the prior art.

Figure 1:
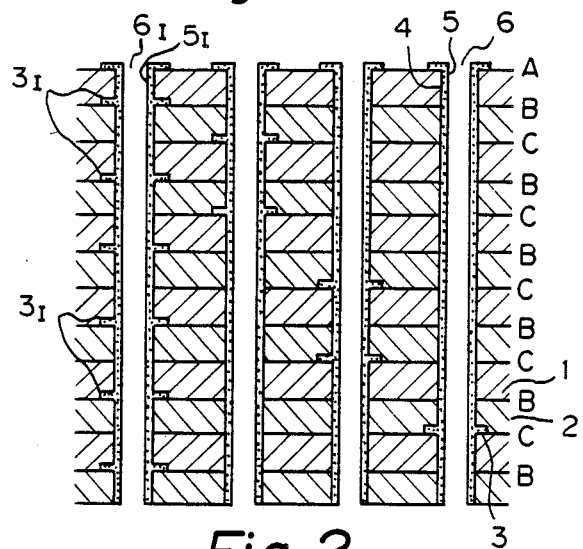
FIG. 1 is a schematic, cross-sectional and elevational view of a conventional multilayer printed circuit board.

FIG. 1 shows a schematic cross-sectional and elevational view of a conventional multilayer printed circuit board having signal layers and electric source layers.

As shown in FIG. 1, a plurality of layers 1 form the multilayer circuit board, and each layer 1 has an insulating plate 2 and a land 3 for a conductor pattern. In this multilayer circuit board, signal layers C and electric source layers B are stacked alternately, one upon the other.

To form a conductor portion, holes 4 are opened in the vertical direction in the stack of the layers 1 and these holes 4 are plated with copper to form through holes 6, so that the lands 3 formed in the signal layers C and electric source layers B are electrically connected to the conductor portion.

When the electric source is the same for each electric source layer B, one through hole $6_I$ is provided for the electric source so that all of the lands $3_I$ are electrically connected to the conductor portion of the through hole $6_I$, and thus the conductor pattern or land adjacent to the through hole $6_I$ connecting each electric source layer B can be made the same.

However since the lands $3_I$ of all of the electric source layers B are electrically connected to a conductor portion formed in the through hole $6_I$, in addition to the number of lands $3_I$ a number of insulating plates 2 must be drilled to form the through hole $6_I$, by, for example, a drill. As mentioned previously, this means that a large load is imposed on the drill, and thus the problems of drill bit breakage and bends in the through hole occur.

Furthermore, when the number of signal layers C is increased, adjacent signal layers C must be brought closer together, causing mutual interference between the layers C and increasing the occurrence of noise.

To prevent this occurrence of noise, ground layers are arranged at intervals between the signal layers C, and since these ground layers are of copper and can be made to have the same conductor pattern, the lands of the ground layers can be electrically connected to the conductor portion formed in a through hole $6_I$.

However, although the addition of the ground layers reduces the occurrence of noise, it increases the problem of the heavy load already imposed on the drill when drilling the signal layers C.

Figure 2:
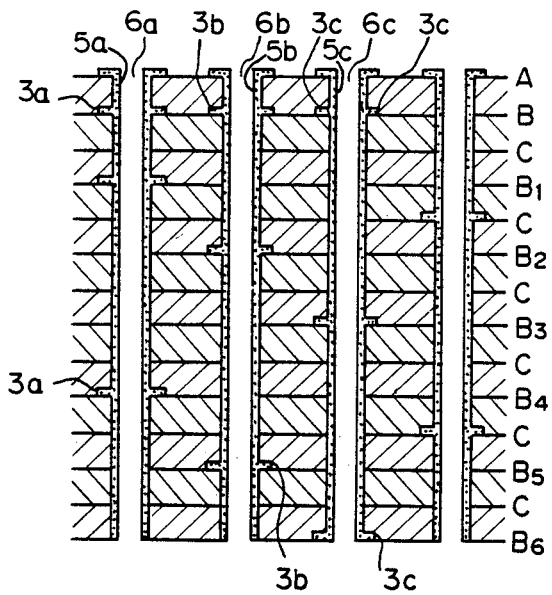
FIG. 2 is a schematic, cross-sectional and elevational view of an example of a multilayered printed circuit board according to the present invention.

FIG. 2 shows a schematic cross-sectional view of an example of a printed circuit board according to the present invention.

As shown in FIG. 2, a multilayer printed board has signal layers C and electric source layers B, $B_1, \ldots, B_6$ having the same electric source, for example, 4 V. The signal layers C and the electric source layers B, $B_1, \ldots, B_6$ are alternately stacked to form a packaged multilayer printed circuit board. Further, three through holes 6a, 6b, and 6c are provided in which are formed conductors for the electric source supply.

Lands 3a, 3b, and 3c of the uppermost (or first) electric source layer B are electrically connected to the conductor portions 5a, 5b, and 5c formed in the through holes 6a, 6b, and 6c, respectively.

In this embodiment of the present invention, the land 3a of the second electric source layer $B_1$ is also electrically connected to the conductor portion 5a formed in the through hole 6a; the land 3b of the third electric source layer $B_2$ is electrically connected to the conductor portion 5b formed in the through hole 6b; and the land 3c of the fourth electric source layer $B_3$ is electrically connected to the conductor portion 5c formed in the through hole 6C. In turn, the lands of the electric source layers $B_4$, $B_5$, and $B_6$ are also electrically connected to the conductor portions 5a, 5b, and 5c, respectively. Thus, all of the lands are electrically connected to the conductor portions in such a manner that the conductor pattern thereof is equally distributed.

Accordingly, in this example of a printed circuit board according to the present invention, the number of lands connected to each through hole is substantially decreased to $\frac{1}{3}$ of the number connected in the conventional manner.

Figure 3:
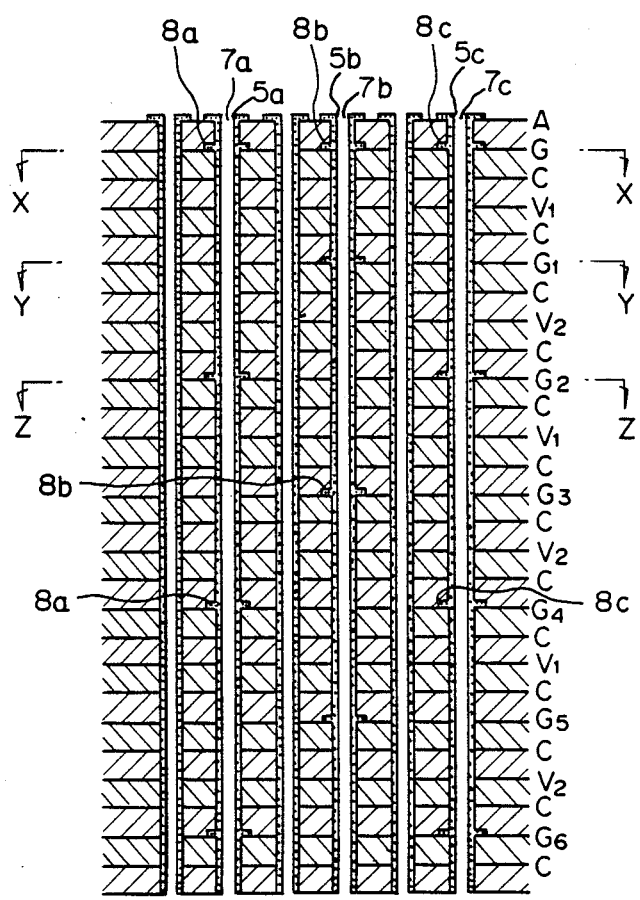
FIG. 3 is a schematic cross-sectional view of another example of a multilayer printed circuit board according to the present invention.
Figure 4A:
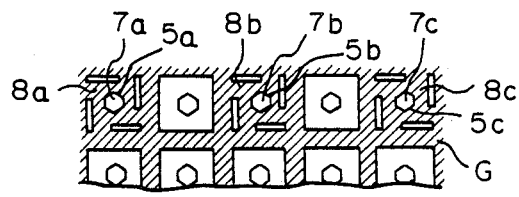
FIGS. 4A to 4C are schematic plan views illustrating cut faces taken along the lines X—X, Y—Y, and Z—Z of FIG. 3, respectively.
Figure 4B:
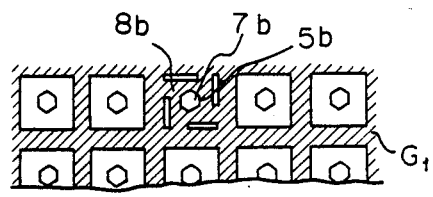
Figure 4C:
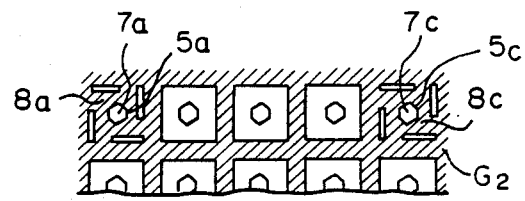

FIG. 3 shows a schematic, cross-sectional and elevational view of another example of a printed circuit board according to the present invention, and FIGS. 4A to 4C are schematic plan views illustrating cut faces taken along the lines X—X, Y—Y, and Z—Z of FIG. 3, respectively.

As shown in FIGS. 3 and 4A to 4C ground layers G, $G_1, \ldots, G_6$ are arranged at intervals between respective signal layers C. In this example, through holes 7a, 7b, and 7c are provided for connection of the ground layers, in addition to the through holes 5a, 5b, and 5c provided for connection of the signal layers C and electric source layers V1, V2. In this embodiment of the present invention, the lands 8a, 8b, and 8c of the uppermost ground layer G are electrically connected to the conductor portions 5a, 5b, and 5c formed in through holes 7a, 7b, and 7c, respectively, as shown, particularly, in FIG. 4A.

As can be seen from FIGS. 3, 4B, and 4C, the land 5b of the ground layer $G_1$ is electrically connected to the conductor portion 5b formed in a through hole 7b, and the lands 8a and 8b of the ground layer $G_2$ are electrically connected to the conductor portions 5a and 5c formed in through holes 7a and 7c. In turn, the lands of ground layer $G_3, G_4 \ldots, G_6$ are connected in a substantially equally distributed pattern to the respective conductor portions.

The number of through holes and the grouping of the lands, etc., is not particularly critical, and may be changed as occasion demands.

We claim:

1. A high density multilayer printed circuit board comprising:

a plurality of conductive layers comprising plural signal layers plural electric source layers, and plural ground layers;

plural insulating layers disposed respectively and selectively between adjacent said signal layers and said electric source layers, between adjacent said electric source layers and said ground layers and between adjacent said ground layers and said signal layers, said plural conductive and plural insulating layers being disposed in superposed, generally parallel relationship;

plural through holes extending through said circuit board transversely to said parallel, plural conductive and insulating layers thereof, and conductor portions formed in each of said through holes;

a first plurality of said through holes being associated with said plural electric source layers and a second plurality of said plural through holes being associated with said plural ground layers; and conductive lands selectively formed on respective said electric source layers for selectively connecting each said electric source layer to said conductor portion of an individual and respectively corresponding one of said first plurality of through holes, and further conductive lands selectively formed on said ground layers for selectively connecting each said ground layer to said conductive portion of an individual and respectively corresponding one of said second plurality of through holes, said conductive lands associated with said electric source layers and said further conductive lands associated with said plural ground layers being substantially equally distributed in a transverse direction through said printed circuit board with respect to the respective said first and said second pluralities of through holes respectively associated with said plural electric source layers and said plural ground layers.

2. A high density multilayer printed circuit board according to claim 1, wherein said lands of said electric source layers are substantially equally distributed among said conductor portions of three said respectively associated through holes.

3. A high density multilayer printed circuit board according to claim 1, wherein said lands of said ground layers are substantially equally distributed among said conductor portions of three said respectively associated through holes.

* * * * *

UNITED STATES PATENT AND TRADEMARK OFFICE
CERTIFICATE OF CORRECTION

PATENT NO.  : 4,675,789

DATED       : June 23, 1987

INVENTOR(S) : Kuwabara et al.

It is certified that error appears in the above-identified patent and that said Letters Patent is hereby corrected as shown below:

Col. 3, line 53, "in a" should be --in--.

Col. 4, line 10, "layers" (first occurrence), should be --layers,--.

Signed and Sealed this

Twenty-fourth Day of November, 1987

Attest:

DONALD J. QUIGG

Attesting Officer

Commissioner of Patents and Trademarks